(12) United States Patent
Mizushima

(10) Patent No.: US 8,841,697 B2
(45) Date of Patent: Sep. 23, 2014

(54) METHOD OF MANUFACTURING SEMICONDUCTOR DEVICES

(71) Applicant: Fuji Electric Co., Ltd., Kawasaki (JP)

(72) Inventor: Tomonori Mizushima, Matsumoto (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/924,730

(22) Filed: Jun. 24, 2013

(65) Prior Publication Data
US 2013/0313676 A1 Nov. 28, 2013

Related U.S. Application Data

(62) Division of application No. 13/294,169, filed on Nov. 10, 2011, now Pat. No. 8,492,254.

(30) Foreign Application Priority Data

Nov. 17, 2010 (JP) .................................. 2010-256493

(51) Int. Cl.
*H01L 29/66* (2006.01)
*H01L 29/872* (2006.01)

(52) U.S. Cl.
CPC ........ *H01L 29/872* (2013.01); *H01L 29/66143* (2013.01); *H01L 29/8725* (2013.01)
USPC ........... 257/109; 257/267; 257/280; 257/281; 257/282; 257/283; 257/284; 257/E29.338

(58) Field of Classification Search
USPC ......... 257/109, 267, 280, 281, 282, 283, 284, 257/E29.338
See application file for complete search history.

(56) References Cited

U.S. PATENT DOCUMENTS

| | | |
|---|---|---|
| 2003/0040144 A1 | 2/2003 | Blanchard et al. |
| 2005/0062124 A1 | 3/2005 | Chiola |
| 2011/0227151 A1 | 9/2011 | Hsu et al. |

FOREIGN PATENT DOCUMENTS

| | | |
|---|---|---|
| JP | 2002-050773 A | 2/2002 |
| JP | 2002-208711 A | 7/2002 |
| JP | 2002-334997 A | 11/2002 |
| JP | 2005-501408 A | 1/2005 |
| JP | 2008-533696 A | 8/2008 |

OTHER PUBLICATIONS

Manoj Mehrotra et al., "Trench MOS Barrier Schottky (TMBS) Rectifier: a Scottky Rectifier with Higher Than Parallel Plane Breakdown Voltage", Solid-State Electronics, vol. 38, No. 4, pp. 801-806, 1995.
Japanese Office Action issued on Apr. 22, 2014 with an English translation.

*Primary Examiner* — Asok K Sarkar
(74) *Attorney, Agent, or Firm* — Rabin & Berdo, P.C.

(57) ABSTRACT

A method of manufacturing a semiconductor device is disclosed. The method includes forming a first trench and a second trench in an n-type substrate surface, the first trenches being spaced apart from each other, the second trench surrounding the first trenches, the second trench being wider than the first trench. The method also includes forming a gate oxide film on the inner surfaces of the first and second trenches, and depositing an electrically conductive material to the thickness a half or more as large as the first trench width. The method further includes removing the electrically conductive material using the gate oxide film as a stopper layer, forming an insulator film thicker than the gate oxide film, and polishing the insulator film by CMP for exposing the n-type substrate and the electrically conductive material in the first trench.

3 Claims, 13 Drawing Sheets

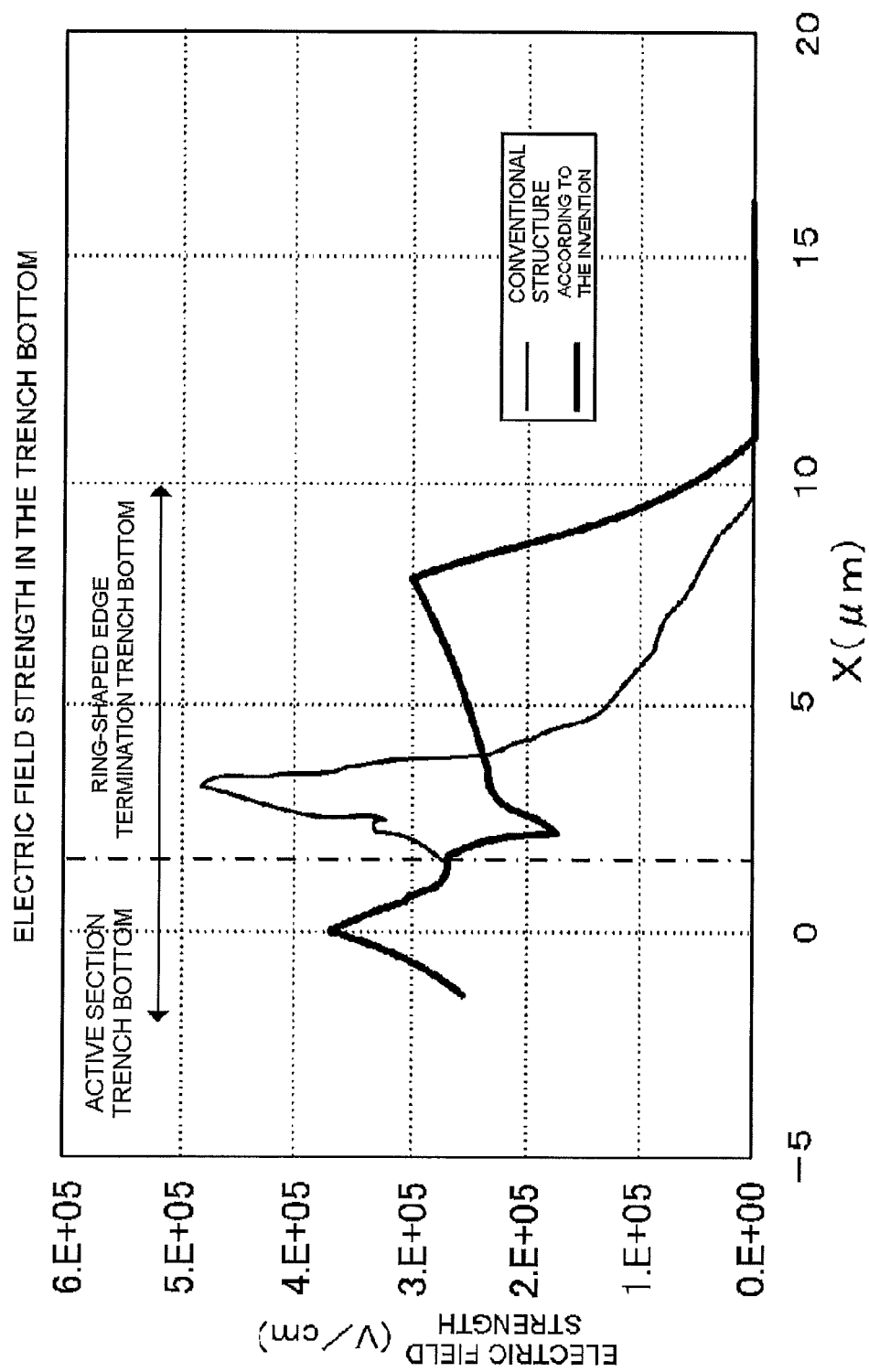

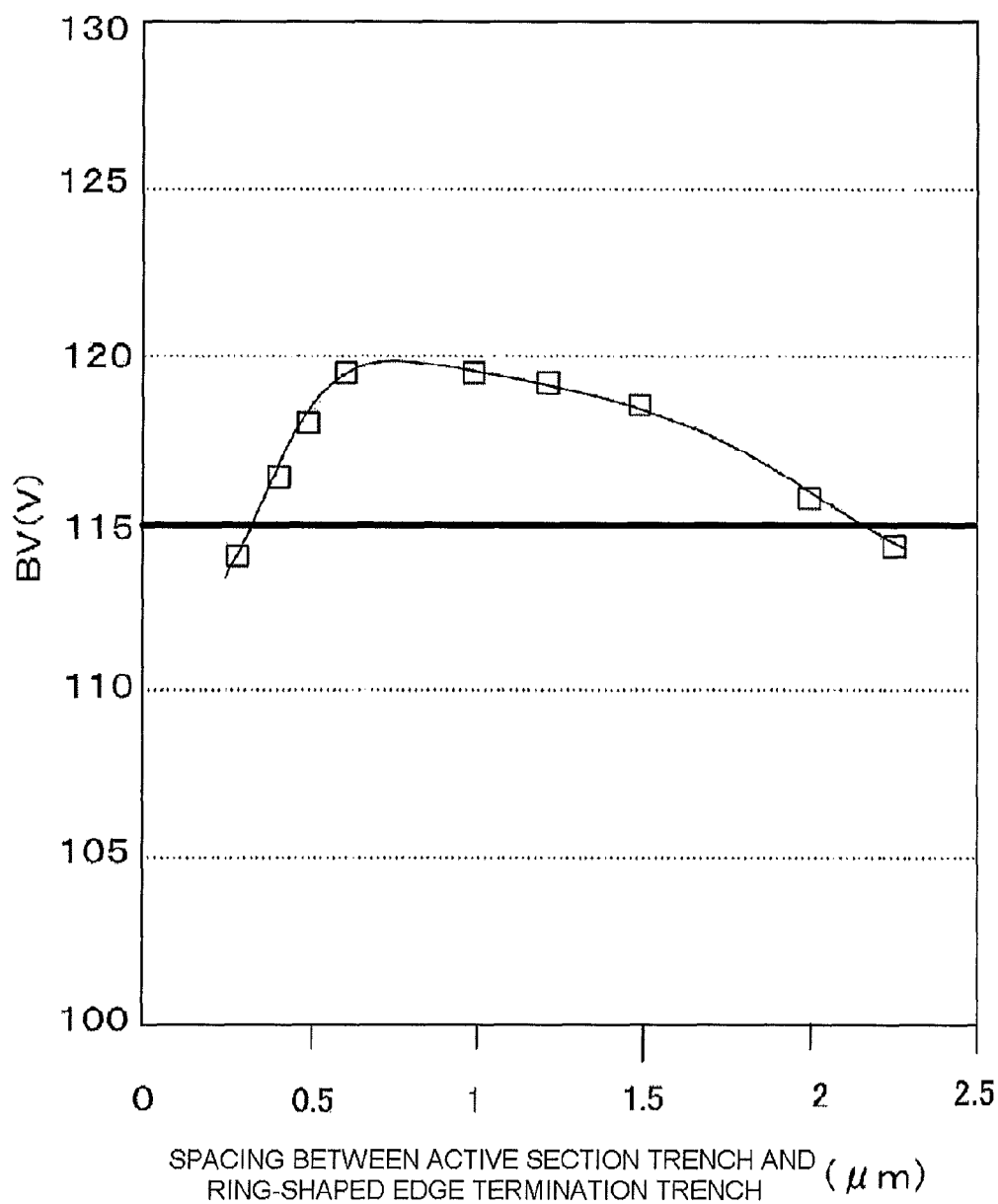

METHOD OF MANUFACTURING SEMICONDUCTOR DEVICES

CROSS REFERENCE TO RELATED APPLICATION

This application is a divisional of application Ser. No. 13/294,169, filed on Nov. 10, 2011. Furthermore, this application claims the benefit of priority of Japanese application 2010-256493, filed Nov. 17, 2010. The disclosures of these prior U.S. and Japanese applications are incorporated herein by reference.

FIELD OF THE INVENTION

The present invention relates to a method of manufacturing semiconductor devices. Specifically, the invention relates to a method of manufacturing a Schottky barrier diode (hereinafter referred to as a "SBD") that facilitates improving the electric field relaxation performances in the edge termination structure thereof.

BACKGROUND

FIG. 7 is the cross sectional view of general planar SBD 100.

SBD 100 includes n+-type semiconductor substrate 1, n-type semiconductor layer 2 grown epitaxially on semiconductor substrate 1, anode electrode 3 coated on semiconductor layer 2 for forming a Schottky junction with semiconductor layer 2, and cathode electrode 4 on the back surface of n+-type semiconductor substrate 1 for forming an ohmic contact with semiconductor substrate 1. SBD 100 further includes a p-type semiconductor region as guard ring 5 in the surface portion of semiconductor substrate 1 in the edge area of the Schottky junction section. Guard ring 5 is in contact with a part of anode electrode 3. Insulator film 6 is coated from the device edge side surface of guard ring 5 to the outer edge of n-type semiconductor layer 2.

Generally, it is possible to control the barrier height in the junction plane between the anode electrode and the n-type semiconductor layer in the SBD by changing the anode electrode material. It is possible to set the built-in potential in the SBD to be lower than the built-in potential in the general pn-diode. Since no minority carrier accumulation occurs in the SBD fundamentally, the SBD switches advantageously at a high-speed with a low switching loss. However, a high leakage current is caused in the SBD, when a reverse bias voltage is applied. Since no conductivity modulation occurs in the SBD, the ON-state resistance in the SBD exhibiting a high breakdown voltage becomes higher than the ON-state resistance in the pn-diode, when a high current is made to flow therein.

It is well known that there exists a tradeoff relation between the ON-state resistance and the leakage current in the SBD. The ON-state resistance of the n-type semiconductor layer may be lowered by increasing the impurity concentration therein. However, it is hard for the depletion layer expanding from the Schottky junction to expand into the n-type semiconductor layer and the electric field strength in the vicinity of the Schottky junction reaches the critical electric field strength of silicon easily under a low reverse bias voltage applied, resulting in a low breakdown voltage. Further, since the surface electric field strength becomes stronger in the edge area of the anode electrode and in the vicinity thereof, the leakage current increases.

In the SBD, in which the impurity concentration in n-type semiconductor layer 2 is low, a high breakdown voltage is obtained and the leakage current caused is low. However, the ON-state resistance becomes high and losses increase.

In SBD 100 described with reference to FIG. 7, in which a p-type semiconductor region is used as guard ring 5, guard ring 5 will operates as a pn-diode, if the applied voltage exceeds the built-in potential to the higher side in turning SBD 100 on. Due to the pn-diode operation of guard ring 5, it takes a time to eject the accumulated minority carriers in shifting SBD 100 from the ON-state thereof to the OFF-state thereof. Therefore, the reverse recovery time (Trr) is elongated and SBD 100 is prevented from conducting high-speed operations.

The following Non-Patent Document 1 reports a trench MOS barrier Schottky (hereinafter referred to as "TMBS") rectifier for improving the tradeoff relations caused in the SBD described above. As one of the TMBS diodes, the following Patent Document 1 discloses a TMBS diode including a trench MOS gate structure in the surface thereof as shown in FIG. 8.

TMBS diode 101 shown in FIG. 8 includes a MOS-gate-like structure including trenches 7 formed in the surface portion of a semiconductor substrate, insulator film 8 on the trench 7 inner wall, and electrically conductive material 9 such as polysilicon in the space surrounded by insulator film 8. Trenches 7 are spaced apart from each other for an equal spacing. In the TMBS diode provided with the MOS-gate-like structure as described above, n-type semiconductor layer 2 works as a current path that makes a drift current flow vertically in the ON-state of the TMBS diode. Since a depletion layer expands also from the MOS gate, when a reverse bias voltage is applied, a pinch-off effect is obtained. Due to the pinch-off effect, the electric field in the semiconductor surface is relaxed, the breakdown voltage is improved, and the leakage current is reduced. By adjusting the spacing between trenches 7 and the impurity concentration in n-type semiconductor layer 2, a lower ON-state resistance is obtained in the TMBS diode at a leakage current equivalent to the leakage current caused in the usual planar diode that includes no trench.

The following Patent Documents 2 and 3 disclose TMBS diodes which have a structure including an edge termination trench, a thick insulator film in the edge termination trench, and a field plate on the thick insulator film for improving the breakdown voltage.

[Patent Document 1] Japanese Unexamined Patent Application Publication No. 2002-50773
[Patent Document 2] Japanese Unexamined Patent Application Publication No. 2002-208711
[Patent Document 3] Published Japanese Translation of PTC International Publication for Patent Application No. 2008-533696
[Non-Patent Document 1] M. MEHROTRA and B. J. BALIGA, "Trench MOS Barrier Schottky (TMBS) Rectifier: A Schottky Rectifier with Higher than Parallel Plane Breakdown Voltage", Solid State Electronics, vol. 38, No. 4 (1995), pp. 801-806

The TMBS structure as disclosed in the Patent Document 1 poses the problem described below.

In the TMBS structure shown in FIG. 8, the breakdown voltage thereof peaks at the predetermined spacing between trenches 7 (at the predetermined mesa region 10 width) as described in FIG. 9. For increasing the device breakdown voltage, it is desirable to design the spacing between trenches 7 at the peak breakdown voltage. However, if the trench 7 spacing is designed at the peak breakdown voltage, the electric field will localize to the location A in the vicinity of the lower portion of an insulator film on the side wall of outermost edge-termination trench 7 in the chip edge area, when a reverse bias voltage is applied. Due to the electric field localization to the location A, breakdown is caused at the location A prior to the breakdown in the Schottky junction section (active section) in the TMBS structure, lowering the breakdown voltage. For obtaining a higher breakdown voltage, the breakdown voltage in the edge termination trench should be made to be higher than the breakdown voltage in the active section.

For obviating the problem described above, the Patent Documents 2 and 3 propose to provide the edge termination trench with a field plate structure. However, the edge termination trench having a field plate structure poses the problems described below.

It is necessary for the manufacture of the TMBS diode disclosed in the Patent Document 2 to pattern and etch an oxide film on the narrow spacer in the edge termination trench. Therefore, it is very difficult to perform the step of pattern etching. Since it is difficult to secure a certain process margin in providing the edge termination trench with a field plate structure, it is hazardous to realize a stable manufacturing process.

It is necessary for the TMBS diode disclosed in the Patent Document 3 to thicken the oxide film in the trench bottom by thermal oxidation. However, since it is very difficult for the thermal oxidation technique to form an oxide film of 1 μm or more in thickness, there exists a certain limitation in obtaining a higher breakdown voltage.

In view of the foregoing, it would be desirable to obviate the problems described above. It would be also desirable to provide a method of manufacturing a semiconductor device including a trench MOS gate structure that facilitates relaxing the electric field strength in the vicinity of the Schottky junction under a reverse bias voltage applied. It would be further desirable to provide a method of manufacturing a semiconductor device that facilitates thickening the insulator film in the bottom of a ring-shaped edge termination trench surrounding the trench MOS gate structure to sustain a stronger electric field. It would be further desirable to provide a method of manufacturing a semiconductor device that includes an edge termination structure that exhibits a higher breakdown voltage.

SUMMARY OF THE INVENTION

According to the invention, there is provided a method of manufacturing a semiconductor device, the semiconductor device including a semiconductor substrate of a first conductivity type, an active section trench, and a ring-shaped edge termination trench spaced apart from the nearest one of the active section trenches for a predetermined spacing by a mesa region, the ring-shaped edge termination trench being wider than the active section trench, the ring-shaped edge termination trench surrounding the active section trenches, the method including:

(a) forming the active section trenches and the ring-shaped edge termination trench simultaneously in the semiconductor substrate;

(b) forming a gate oxide film on the inner surface of the active section trench and on the inner surface of the ring-shaped edge termination trench;

(c) depositing an electrically conductive material on the entire surface of the semiconductor substrate to a thickness a half or more as large as a width of the active section trench;

(d) removing the electrically conductive material on the surface of the mesa region by anisotropic etching using the gate oxide film on the surface of the mesa region as a stopper layer;

(e) forming an oxide film on the semiconductor substrate, the oxide film being thicker than the gate oxide film;

(f) polishing the oxide film with a chemical mechanical polishing apparatus for exposing the semiconductor substrate to the surface of the mesa region and for exposing the electrically conductive material to the opening of the active section trench;

(g) coating an electrode material that forms a Schottky junction with the surface of the semiconductor substrate exposed to the surface of the mesa region for forming an electrode film; and (h) removing the edge area of the electrode film by etching for positioning the resulting edge of the electrode film on the oxide film in the ring-shaped edge termination trench.

Advantageously, the width of the active section trench is smaller than the depth of the active section trench, and the width of the ring-shaped edge termination trench is larger than the depth of the ring-shaped edge termination trench.

Advantageously, the method includes:

leaving the electrically conductive material as spacers in the active section trench and on the inner side wall of the ring-shaped edge termination trench after the anisotropic etching in the step (d), polishing the oxide film with the chemical mechanical polishing apparatus for exposing the semiconductor substrate to the surface of the mesa region, for exposing the electrically conductive material to the opening of the active section trench, and for removing the oxide film on the spacer on the inner side wall of the ring-shaped edge termination trench further for exposing the spacer on the inner side wall of the ring-shaped edge termination trench in the step (f), and coating the electrode material on the surface of the semiconductor substrate exposed to the surface of the mesa region for forming the electrode film and for making the electrode film contact with the surface of the spacer in the step (g).

Advantageously, the method includes etching the spacer for positioning the surface thereof at the elevation lower than the surface of the mesa region in the step (d), making the oxide film remain on the spacer after the polishing with the chemical mechanical polishing apparatus in the step (f), and coating the electrode material on the surface of the semiconductor substrate exposed to the surface of the mesa region for forming an electrode film and for making the electrode film contact with the surface of the spacer with the oxide film interposed between the electrode film and the spacer in the step (g).

Advantageously, the method includes forming a sacrifice oxide film in subsequent to the step (f) and removing the sacrifice oxide film in advance to the step (g).

According to the invention, there is provided a method of manufacturing a semiconductor device that facilitates forming a trench MOS gate structure for relaxing the electric field strength in the vicinity of the Schottky junction under the reverse bias voltage applied, thickening the insulator film in the bottom of the ring-shaped edge termination trench surrounding the trench MOS gate structures for sustaining a strong electric field, and providing the edge termination structure with a higher breakdown voltage.

BRIEF DESCRIPTIONS OF THE DRAWINGS

FIG. 3 is a pair of curves comparing the electric field strengths in the active section trench bottom and in the ring-shaped edge termination trench bottom in the TMBS diode according to the first embodiment of the invention and in the conventional TMBS diode.

FIG. 12 is a curve relating the breakdown voltage with the spacing between the active section trench and the ring-shaped edge termination trench.

MODES FOR CARRYING OUT THE INVENTION

Now the invention will be described in detail hereinafter with reference to the accompanied drawings which illustrate the preferred embodiments of the invention.

Although the invention is described in connection with the preferred embodiments thereof, changes and modifications are obvious to the persons skilled in the art without departing from the true spirit of the invention. Therefore, the invention be understood not by the specific descriptions herein but by the appended Claims thereof.

In the following descriptions, the "active section" implies the section that includes first trenches and makes a main current flow therein.

First Embodiment

Figure 1:
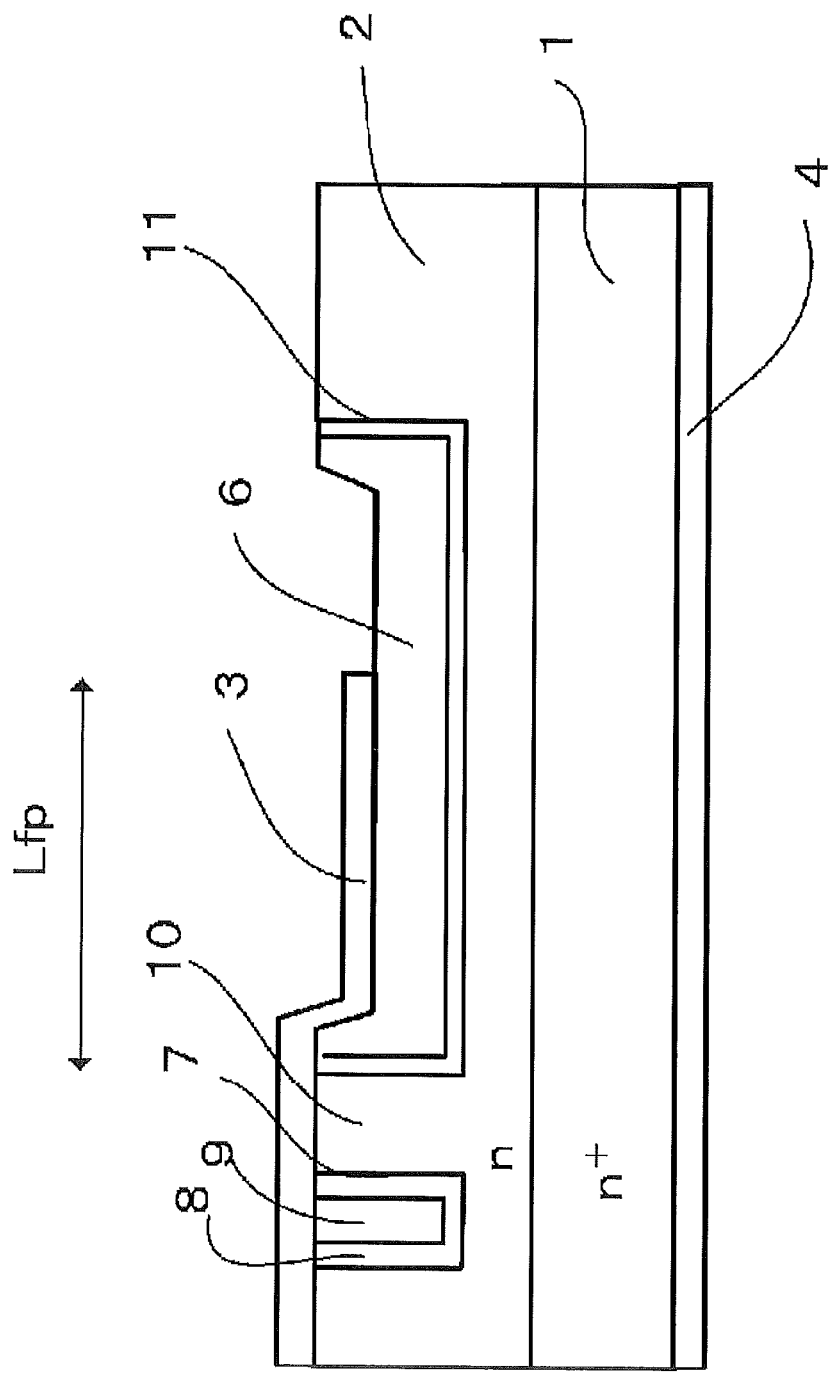
FIG. 1 is the cross sectional view of a trench MOS barrier Schottky (TMBS) diode according to a first embodiment of the invention showing the edge termination structure and the vicinity thereof.

Now a method of manufacturing a semiconductor device according to a first embodiment of the invention will be described below with reference to FIGS. 1 through 2(f). FIG. 1 is the cross sectional view of a trench MOS barrier Schottky (TMBS) diode according to a first embodiment of the invention showing the edge termination structure and the vicinity thereof. FIGS. 2(a) through 2(f) are the cross sectional views of a semiconductor substrate describing the manufacturing steps, through which the TMBS diode shown in FIG. 1 is manufactured.

Figure 2A:
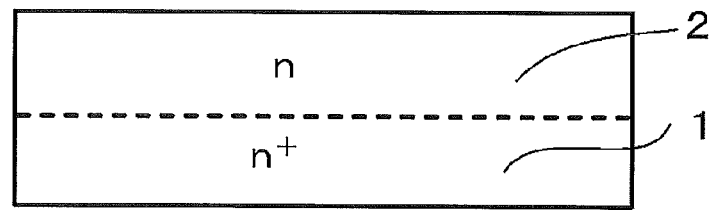
FIG. 2(a) is the first cross sectional view of a semiconductor substrate describing a first manufacturing step for manufacturing the TMBS diode shown in FIG. 1.

Referring at first to FIG. 2(a), n+-type semiconductor substrate 1 is doped heavily and n-type semiconductor layer 2 doped more lightly than semiconductor substrate 1 is grown on semiconductor substrate 1 epitaxially.

In the following descriptions, the trench in the active section will be referred to as the "first trench" and the ring-shaped edge termination trench as the "second trench".

Figure 2B:
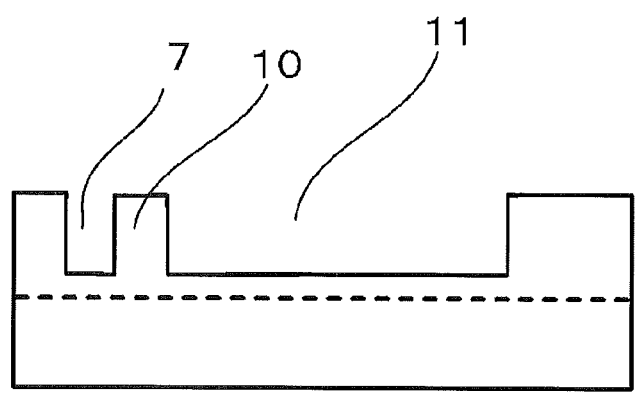
FIG. 2(b) is the second cross sectional view of the semiconductor substrate describing a second manufacturing step for manufacturing the TMBS diode shown in FIG. 1.

Referring now to FIG. 2(b), first trench 7 in the active section and second trench 11 wider than first trench 7 are spaced apart from each other by mesa region 10. First trench 7 and second trench 11 are formed simultaneously by the anisotropic etching technique using a mask pattern formed by combining a photoresist and an oxide film. First trench 7 is shaped with a column, a stripe or a ring. A plurality of first trenches 7 is formed in the active section. In FIGS. 1 through 2(f), one first trench 7 is shown. As far as first trench 7 has any of the shapes, first trenches 7 may be spaced apart from each other for the spacing that can be pinched off by the depletion layer expanding under the reverse bias voltage applied.

First and second trenches 7 and 11 may be the same in depth with no problem, since first and second trenches 7 and 11 are formed simultaneously. In practice however, second trench 11 is a little bit deeper than first trench 7 due to the width difference between first and second trenches 7 and 11. The trench depths may be selected from the range between 0.5 μm and 15 μm. When the trench depth is less than 0.5 μm, the effects due to the TMBS structure are obtained hardly. When the trench depth is more than 15 μm, it is too difficult to form such a deep trench. Since it is also difficult to form thick oxide film 6 on the side wall of such a deep trench, it is difficult to secure the designed breakdown voltage. Therefore, the deep trench 15 μm or more in depth is not practical.

The first trench 7 width may be smaller than the depth thereof. It is preferable for the second trench 11 width to be much larger than the first trench 7 width and to be larger than the second trench 11 depth.

Figure 2C:
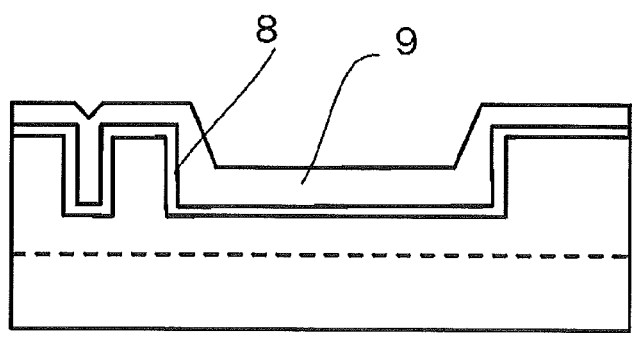
FIG. 2(c) is the third cross sectional view of the semiconductor substrate describing a third manufacturing step for manufacturing the TMBS diode shown in FIG. 1.

Referring now to FIG. 2(c), gate oxide film 8, around 0.1 μm in thickness, is grown on mesa region 10 and on the side walls of first and second trenches 7 and 11 through the step of thermal oxidation. Gate oxide film 8 may be formed of a high temperature oxide film (HTO) and such an insulator film.

Then, electrically conductive material 9 such as polysilicon is deposited through the CVD step.

Electrically conductive material 9 is deposited thick enough to fill first trench 7 completely and high above trench 7 but not so thick as to fill second trench 11 completely. Electrically conductive material 9 may be deposited under conditions under which electrically conductive material 9 being deposited in second trench 11 is shallower than the second trench 11 depth.

Figure 2D:
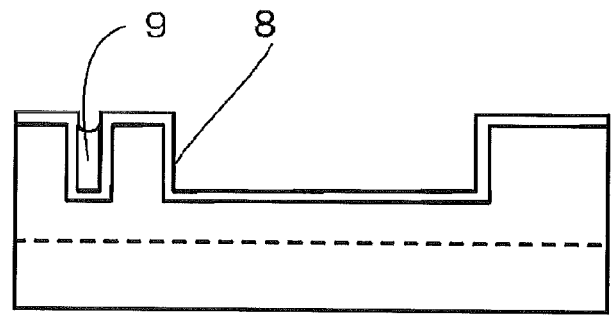
FIG. 2(d) is the fourth cross sectional view of the semiconductor substrate describing a fourth manufacturing step for manufacturing the TMBS diode shown in FIG. 1.

Referring now to FIG. 2(d), electrically conductive film 9 at an elevation higher than the mesa region 10 surface is removed by anisotropic etching using gate oxide film 8 on the mesa region 10 surface as an etching stopper layer. If second trench 11 is much wider than first trench 7, electrically conductive film 9 will remain unremoved in first trench 7. Since the entire inner surface of second trench 11 is etched, electrically conductive film 9 does not remain in second trench 11.

Figure 2E:
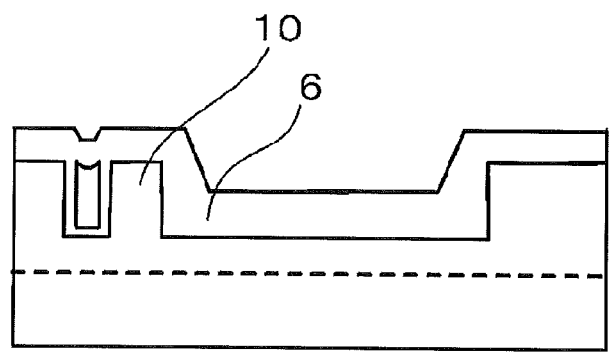
FIG. 2(e) is the fifth cross sectional view of the semiconductor substrate describing a fifth manufacturing step for manufacturing the TMBS diode shown in FIG. 1.
Figure 2F:
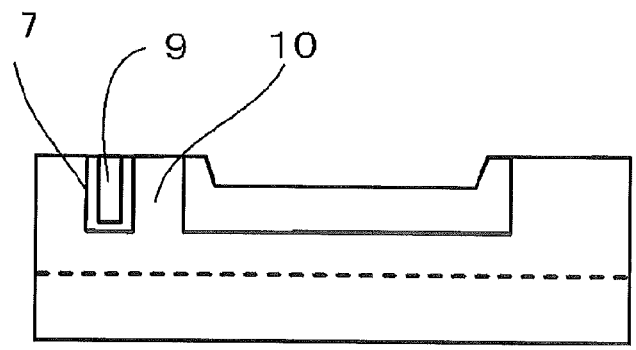
FIG. 2(f) is the sixth cross sectional view of the semiconductor substrate describing a sixth manufacturing step for manufacturing the TMBS diode shown in FIG. 1.

Referring now to FIG. 2(e), an oxide film such as a boro phospho silicate glass (BPSG) film, a tetraethyl orthosilicate (TEOS) film, and a HTO film is formed as insulator film 6 on the entire chip surface for forming an edge termination structure in second trench 11. Although the insulator film 6 thickness is smaller than the second trench 11 depth in FIG. 2(e), insulator film 6 may be thick enough to fill second trench 11 completely with no problem.

Referring now to FIG. 2(f), insulator film 6 and gate oxide film 8 on mesa region 10 and a part of the semiconductor substrate under insulator film 6 and gate oxide film 8 are polished with a not shown chemical mechanical polishing (hereinafter referred to as a "CMP") apparatus to flatten the active section surface in the semiconductor substrate. Electrically conductive material 9 may be exposed in first trench 7 to the opening thereof in the step of flattening so that a first electrode material described later may contact with electrically conductive material 9 in first trench 7.

Since a rough surface happens to be caused on the exposed semiconductor substrate in mesa region 10 flattened by the CMP, it is preferable sometimes to insert the step of sacrifice oxidation (thermal oxidation and oxide film removal) or the step of thermal treatment at a temperature between 900° C. and 1000° C.

Now referring back to FIG. 1, a first electrode film that forms a Schottky junction with the mesa region 10 surface and works as anode electrode 3 is formed by sputtering or by vapor deposition. Then, the edge area of the first electrode film is removed by etching using the photolithographic technique such that the first electrode film is left unremoved for a field plate length (Lfp) on insulator film 6 in second trench 11. The field plate length (Lfp) affects the breakdown voltage.

Figure 10:
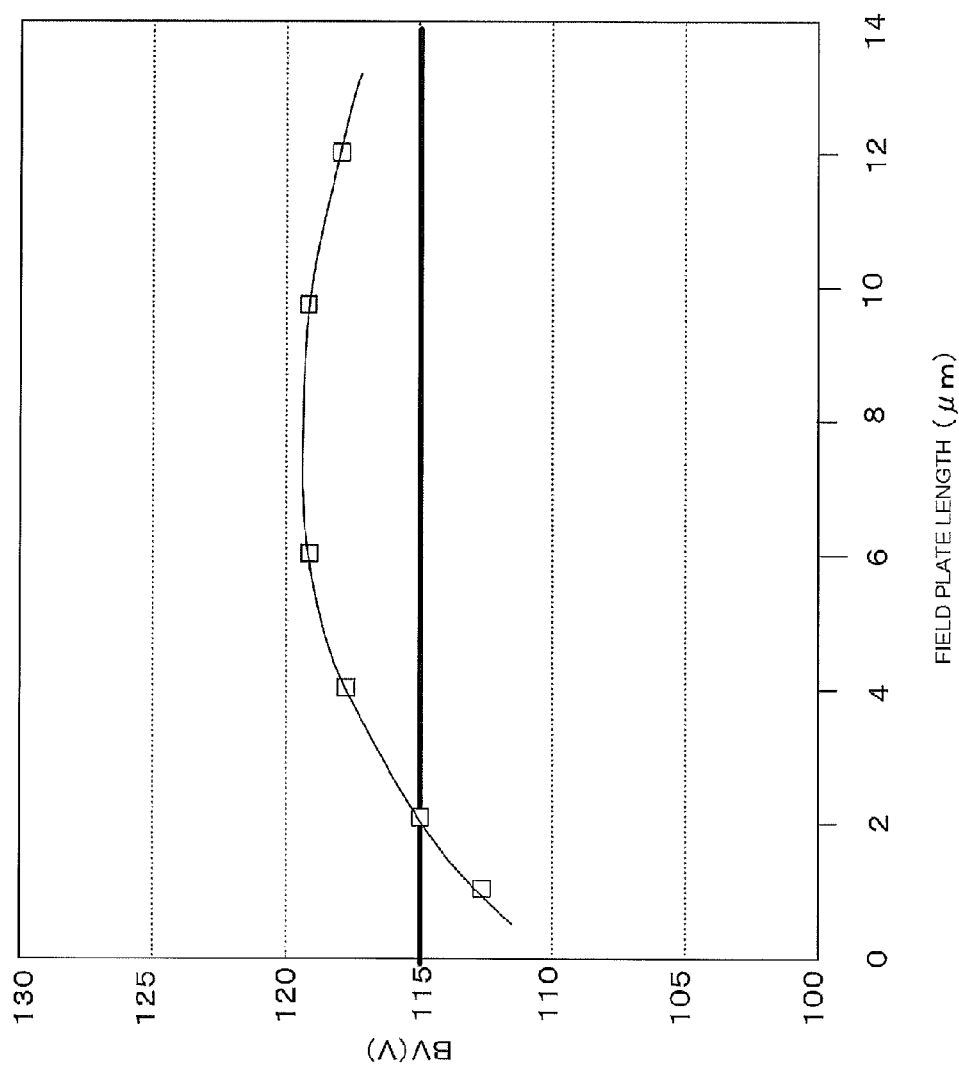
FIG. 10 is a curve relating the breakdown voltage (BV(V)) with the field plate length (Lfp) according to the invention.

FIG. 10 is a curve relating the breakdown voltage (BV(V)) with the field plate length (Lfp).

A breakdown voltage of 115 V represented by the board line in FIG. 10 indicates the breakdown voltage which the active section sustains. When the breakdown voltage in the active section is 115 V and the field plate length (Lfp) is longer than 2 μm, the breakdown voltage which the field plate sustains is higher than the breakdown voltage in the active section preferably. The preferable field plate length changes depending on the trench shape, the impurity concentration in n-type semiconductor layer 2, and such factors. If the breakdown voltage in the field plate section is high, the electric field strength in the active section will reach the critical value prior to the electric field strength in the field plate section. Therefore, the breakdown voltage in the active section determines the breakdown voltage of the device. If the breakdown voltage in the active section determines the breakdown voltage of the device, the breakdown voltage of the device will be more reliable preferably.

Figure 11:
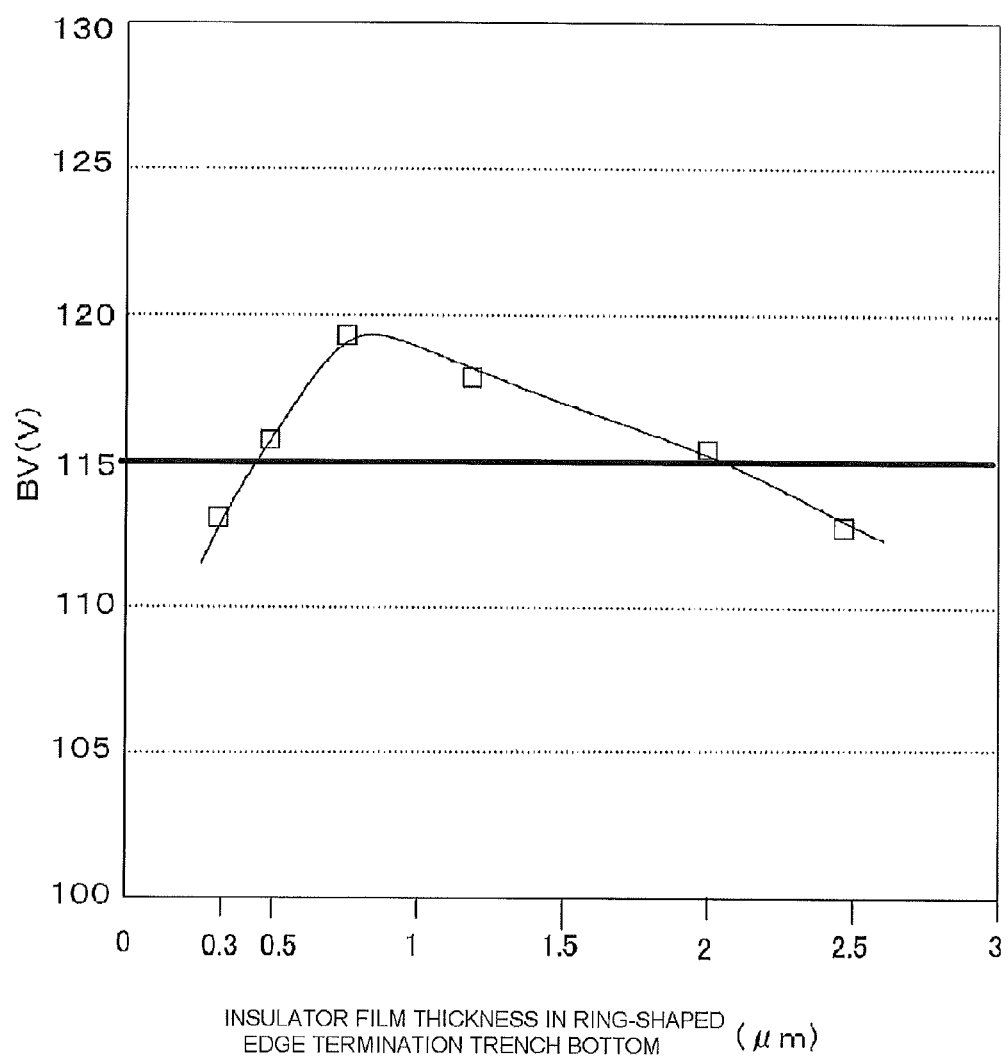
FIG. 11 is a curve relating the breakdown voltage with the thickness of the insulator film in the bottom of the ring-shaped edge termination trench.

The insulator film 6 thickness in second trench 11 affects the breakdown voltage. FIG. 11 is a curve relating the breakdown voltage with the thickness of the insulator film in the bottom of the ring-shaped edge termination trench (second trench). The breakdown voltage of 115 V represented by the board line in FIG. 11 is the breakdown voltage which the active section sustains in the same manner as in FIG. 10.

In FIG. 11, the breakdown voltage is lower than 115 V at the insulator film 6 thickness of 0.3 μm, which is the thickness of gate insulator film 8 formed on the side wall of first trench 7, indicating that electric field localization is caused in the ring-shaped edge termination trench (second trench 11). If the insulator film 6 thickness exceeds 2 μm to the thicker side, the breakdown voltage of the device will be determined by the breakdown voltage between the outermost first trench 7 and second trench 11. Since the relation between the field plate length and the breakdown voltage does not exist anymore, the breakdown voltage of the device lowers.

The preferable range of the insulator film 6 thickness in second trench 11 changes depending on the second trench width and the second trench depth. If the insulator film 6 thickness is larger than the gate oxide film 8 thickness (e.g. 0.1 μm) and smaller than half the second trench 11 depth (e.g. 7.5 μm), insulator film 6 will be in the preferable thickness range thereof. If insulator film 6 is thinner than gate oxide film 8, the breakdown voltage in the active section will lower. If the insulator film 6 thickness is larger than a half of the second trench 11 depth, great difficulties will be caused in the manufacturing process. The preferable insulator film 6 thickness range is between 0.1 μm and 3.0 μm. More preferably, insulator film 6 is between 0.5 μm and 2.0 μm in thickness.

Figure 9:
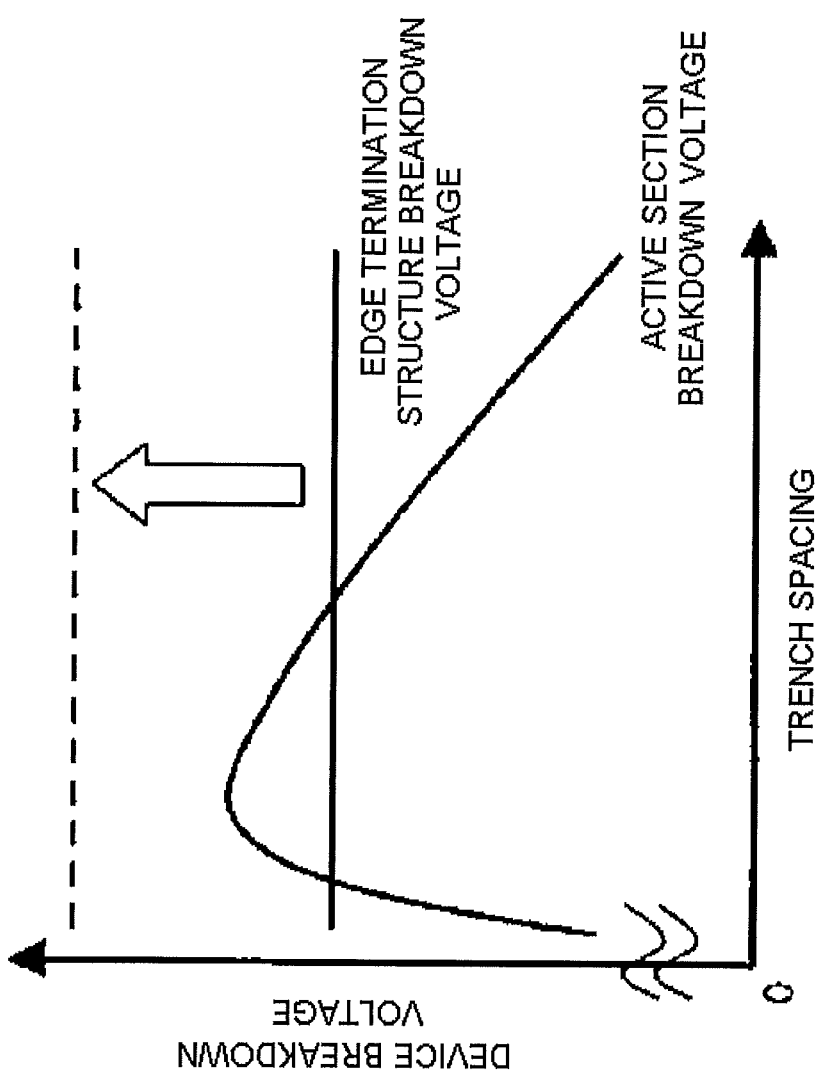
FIG. 9 is the relation between the trench spacing and the breakdown voltage in the conventional TMBS diode.

As described with reference to FIG. 9, there exists an optimum first trench spacing (the optimum spacing between the first trenches) for obtaining the highest breakdown voltage. If the first trench spacing is too wide, pinch off will occur hardly. Since the surface electric field will not be relaxed completely, if pinch off occurs hardly, the device breakdown voltage will be determined by the breakdown voltage in the Schottky junction surface.

If the first trench spacing is too narrow, the equipotential surfaces will distribute between the first trenches too densely, lowering the device breakdown voltage. In detail, if the first trench spacing is 0.5 μm or narrower, the breakdown voltage will lower. At the first trench spacing of 0.5 μm or narrower, the total area of the first trenches is wider than the Schottky junction area (the intrinsic active section area). Since the first trench spacing of 0.5 μm or narrower makes no sense in the practical device design, FIG. 9 indicates substantially that the breakdown voltage is higher as the first trench spacing is narrower.

The similar descriptions apply to the relation between the spacing between the first trench (active section trench) and the second trench (ring-shaped edge termination trench) and the breakdown voltage described in FIG. 12. Therefore, for obtaining a higher breakdown voltage, it is more desirable to narrow the spacing between the first and second trenches rather than to narrow the spacing between the first trenches. FIG. 12 indicates that the preferable spacing between the first and second trenches is from 0.4 μm to 2.0 μm.

Then, the unnecessary layers on the back surface of semiconductor substrate 1 are removed and a second electrode film that will work as cathode electrode 4 is formed on the entire back surface by sputtering or by vapor deposition.

FIG. 3 is a pair of curves comparing the electric field strengths in the active section trench bottom and in the ring-shaped edge termination trench bottom in the TMBS diode according to the first embodiment of the invention and in the conventional TMBS diode under a reverse bias voltage applied.

As described in FIG. 3, the electric field strength in the ring-shaped edge termination trench bottom is very high in the conventional TMBS diode. In the TMBS diode according to the first embodiment, the electric field strength in the active section trench bottom is higher than the electric field strength in the ring-shaped edge termination trench bottom. Moreover, the electric field strength in the ring-shaped edge termination trench bottom is relaxed greatly in the TMBS diode according to the first embodiment such that the electric field strength in the active section trench bottom and the electric field strength in the ring-shaped edge termination trench bottom are well balanced to each other in the lateral direction. In other words, the difference between the electric field strength in the active section trench bottom and the electric field strength in the ring-shaped edge termination trench bottom is small.

Figure 4:
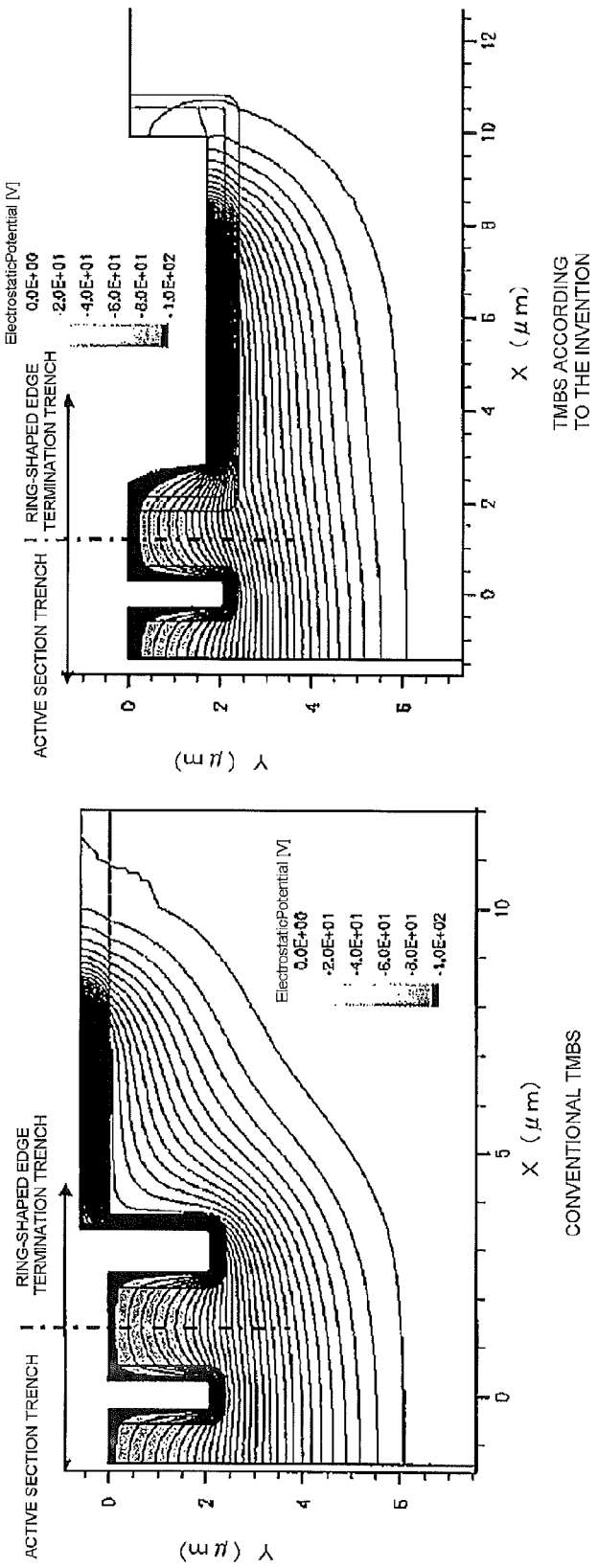
FIG. 4 is the equipotential curve distribution diagrams in the cross sections of the trenches in the conventional TMBS diode and the TMBS diode according to the first embodiment of the invention.

FIG. 4 is the equipotential curve distribution diagrams in the cross sections of the trenches in the conventional TMBS diode and in the TMBS diode according to the first embodiment of the invention.

In the conventional TMBS diode, the equipotential surfaces localize to the ring-shaped edge termination trench bottom. By employing the ring-shaped edge termination trench structure according to the first embodiment, the equipotential surfaces are spaced apart from each other in a well balanced manner and the electric field distribution is improved by the TMBS diode according to the first embodiment of the invention.

Second Embodiment

Figure 5:
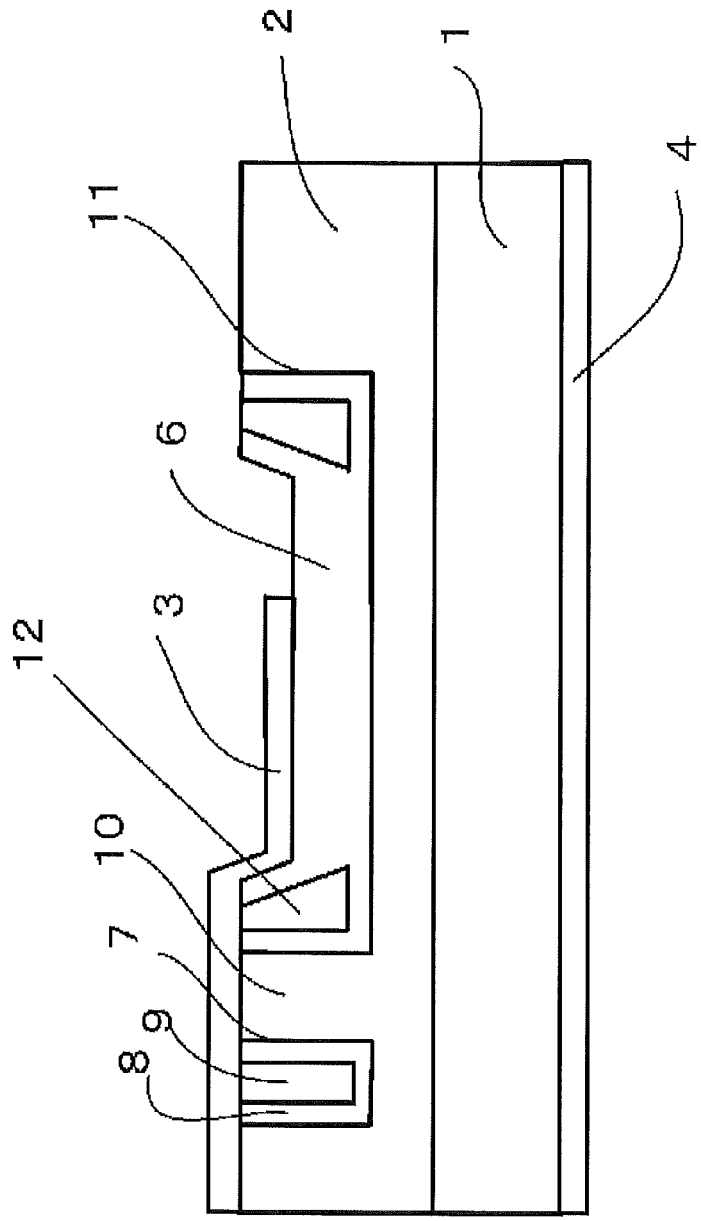
FIG. 5 is the cross sectional view of a TMBS diode according to a second embodiment of the invention showing the edge area thereof.

FIG. 5 is the cross sectional view of a TMBS diode according to a second embodiment of the invention showing the edge area thereof.

In etching electrically conductive material 9 by anisotropic etching, electrically conductive material 9 remains unetched as spacer 12 on the side wall of second trench 11. Since spacer 12 and field plate 3 divide the electric field and sustain the divided electric fields, it is possible to sustain a breakdown voltage higher than the breakdown voltage which the conventional TMBS diode sustains.

Third Embodiment

Figure 6:
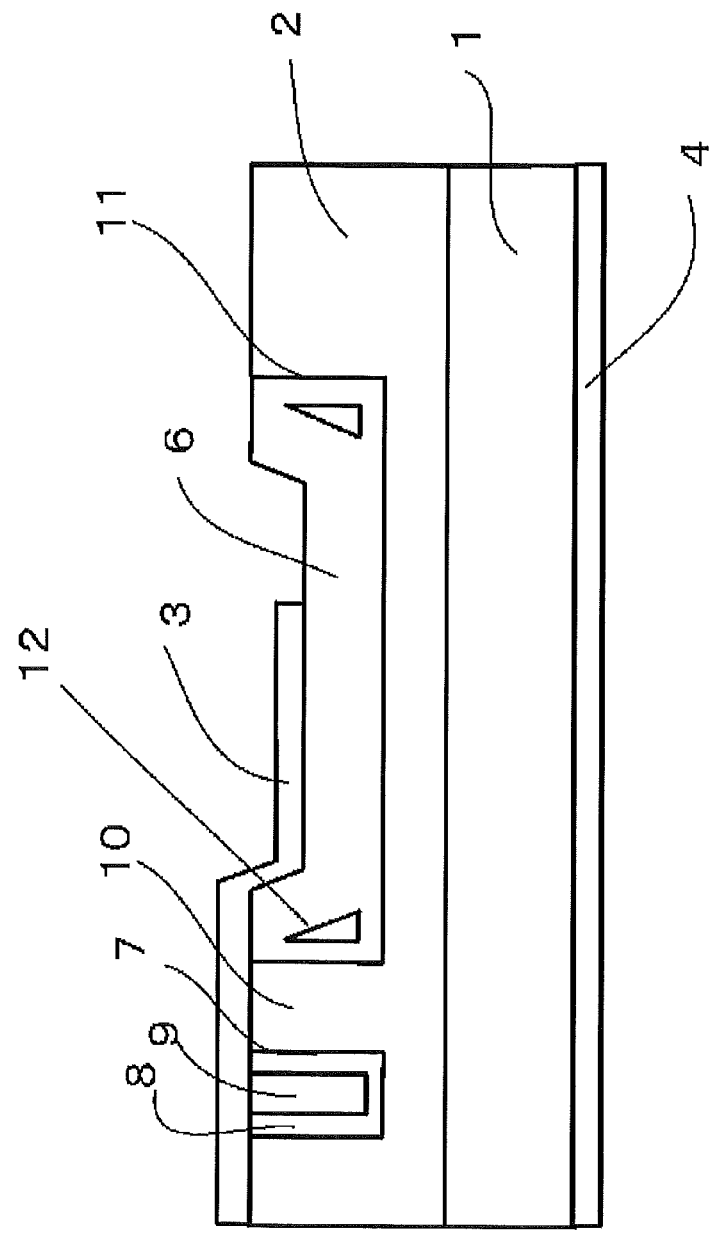
FIG. 6 is the cross sectional view of a TMBS diode according to a third embodiment of the invention showing the edge area thereof.
Figure 7:
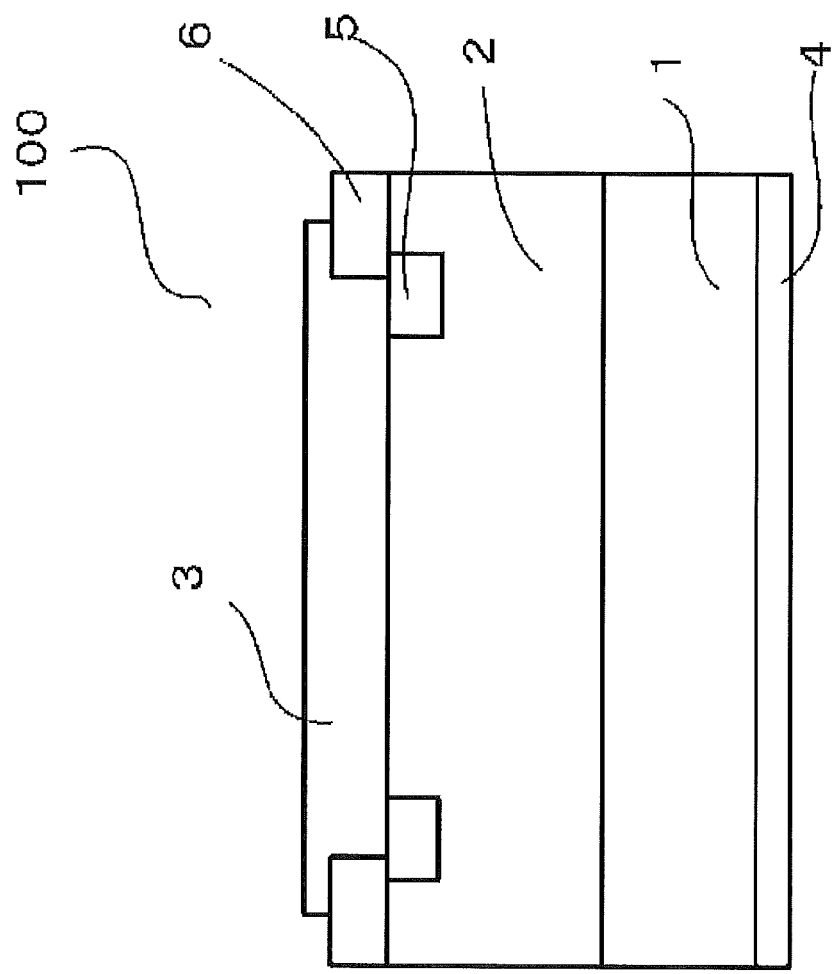
FIG. 7 is the cross sectional view of a conventional planar SBD.
Figure 8:
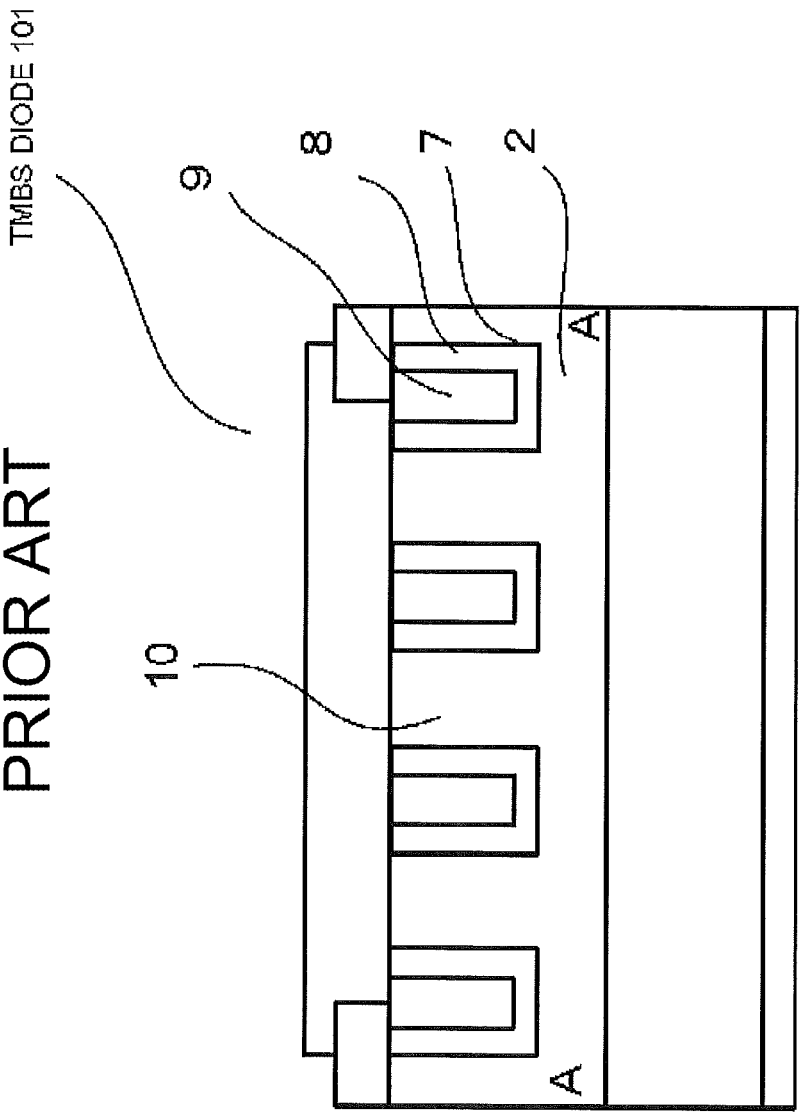
FIG. 8 is the cross sectional view of a conventional TMBD diode.

FIG. 6 is the cross sectional view of a TMBS diode according to a third embodiment of the invention showing the edge area thereof.

In the same manner as the TMBS diode according to the second embodiment, spacer 12 remains on the side wall of second trench 11. However, by adjusting the conditions, under which electrically conductive material 9 is etched, or the conditions, under which the step of surface flattening is conducted, the electrically conductive material 9 surface in second trench 11 is adjusted to be lower than the mesa region 10 surface. If the electrically conductive material 9 surface is adjusted to be lower than the mesa region 10 surface, spacer 12 that is electrically conductive material 9 left unetched will not be in contact with anode electrode 3 but set at a floating potential. The structure according to the third embodiment facilitates sustaining the electric field in the same manner as the structure according to the second embodiment and securing a breakdown voltage higher than the breakdown voltage which the conventional TMBS diode exhibits.

What is claimed is:

1. A semiconductor device, comprising:
a semiconductor substrate of a first conductivity type;
at least one active section trench; and
a ring-shaped edge termination trench spaced apart from a nearest one of the at least one active section trench for a predetermined spacing by a mesa region;
wherein a height of an upper surface of an insulating film buried in the ring-shaped edge termination trench is substantially the same as the height of an exposed surface of the mesa region.

2. The semiconductor device of claim 1, wherein the ring-shaped edge termination trench is deeper than the at least one active section trench.

3. The semiconductor device of claim 1, wherein the at least one active section trench includes a plurality of active section trenches, and a distance between an end portion of one of the plurality of active section trenches and the ring-shaped edge termination trench is narrower than a distance between the plurality of active section trenches.

* * * * *